United States Patent
Chiang

(10) Patent No.: US 8,647,466 B2
(45) Date of Patent: Feb. 11, 2014

(54) COMBINATORIAL EVALUATION OF DRY SEMICONDUCTOR PROCESSES

(75) Inventor: Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 281 days.

(21) Appl. No.: 13/095,443

(22) Filed: Apr. 27, 2011

(65) Prior Publication Data

US 2011/0201136 A1 Aug. 18, 2011

Related U.S. Application Data

(62) Division of application No. 12/550,249, filed on Aug. 28, 2009, now Pat. No. 7,947,531.

(60) Provisional application No. 61/092,718, filed on Aug. 28, 2008.

(51) Int. Cl.
 *H01L 21/306* (2006.01)

(52) U.S. Cl.
 USPC .................. 156/345.3; 257/E21.525; 438/14

(58) Field of Classification Search
 None
 See application file for complete search history.

(56) References Cited

U.S. PATENT DOCUMENTS

2006/0057750 A1 * 3/2006 Aoki et al. ...................... 438/22
2008/0100214 A1 * 5/2008 Chang et al. .................. 313/570

FOREIGN PATENT DOCUMENTS

JP 2001329366 * 11/2001

OTHER PUBLICATIONS

Koiuma (JP 2001-329366) with a machine translated document attached.*
Kionuma (JP 2001-329366) Machine translation, Nov. 27, 2001.*

* cited by examiner

*Primary Examiner* — Yasser A Abdelaziez

(57) ABSTRACT

Combinatorial evaluation of dry semiconductor processes is described, including rotating a mask comprising a plurality of apertures, wherein the mask is positioned between a dry semiconductor processing source and the substrate, and performing a dry semiconductor process through the apertures of the mask at a plurality of intervals during the rotating the mask to combinatorially create a plurality of processed regions on the substrate, wherein the apertures of the mask are arranged in such a way that the plurality of processed regions have different geometries relative to the processing source, and analyzing the processed regions to determine effects of time and geometry on the processed regions.

4 Claims, 7 Drawing Sheets

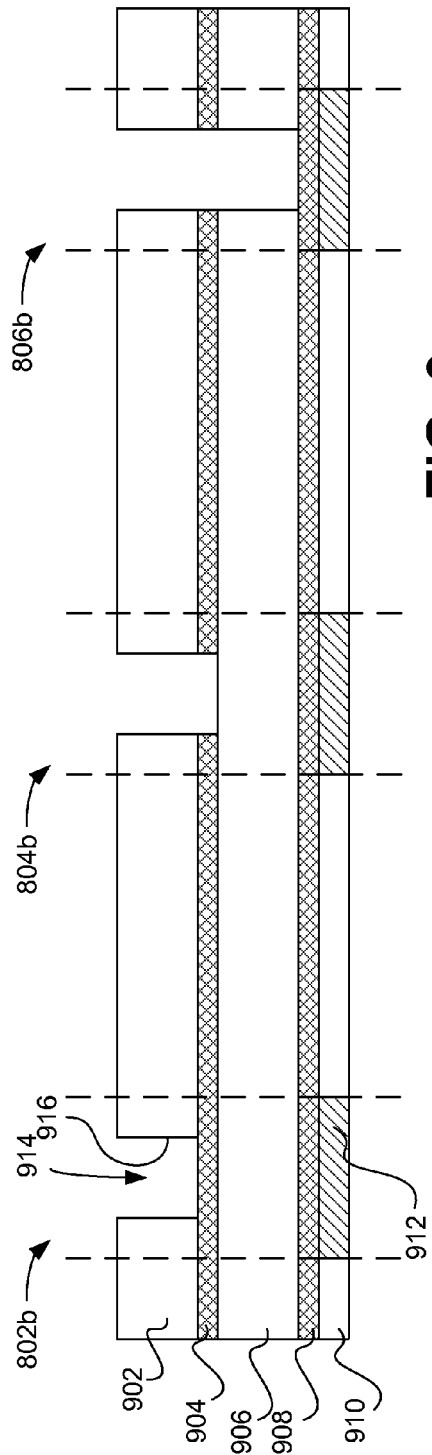
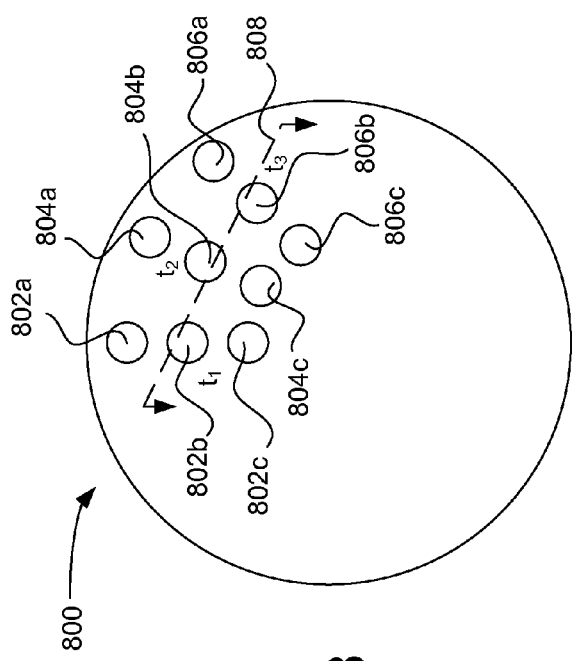
FIG. 9
FIG. 8

COMBINATORIAL EVALUATION OF DRY SEMICONDUCTOR PROCESSES

CROSS REFERENCE TO RELATED APPLICATIONS

This application is a divisional application of U.S. patent application Ser. No. 12/550,249, which claims the benefit of U.S. Provisional Application No. 61/092,718 entitled "Combinatorial Evaluation of Dry Semiconductor Processes" and filed on Aug. 28, 2008, which is incorporated herein by reference.

FIELD OF THE INVENTION

The present invention relates generally to semiconductor processing. More specifically, techniques for combinatorially evaluating dry semiconductor processing techniques are described.

BACKGROUND OF THE INVENTION

Semiconductor devices such as integrated circuits (ICs) can be formed using a variety of processing techniques including wet and dry processes. Dry processes are those that generally do not include the introduction of liquids. Examples of dry processes are additive processes such as chemical vapor deposition (CVD) and physical vapor deposition (PVD) and subtractive processes such as dry (e.g., plasma or ion) etching.

Etching is a subtractive process that can be used to remove portions of a semiconductor substrate. For example, a trench or via can be created in an interlayer dielectric (ILD) by etching away a portion of the interlayer dielectric. Other processes, such as metallization to add copper or other conductive lines in the etched regions can subsequently be performed.

Dry etching techniques include those that expose a substrate or other semiconductor material to ions, such as reactive ion etching (RIE) or plasma-based etching. The results of dry etching techniques can depend heavily on a variety of processing parameters. Additionally, other dry semiconductor processing techniques, such as those using flux-based processes (e.g. physical vapor deposition), can also depend heavily on processing parameters.

Thus, what is needed is a technique to effectively evaluate processing parameters of dry semiconductor processing techniques.

BRIEF DESCRIPTION OF THE DRAWINGS

Various embodiments of the invention are disclosed in the following detailed description and the accompanying drawings:

FIG. 8 illustrates an overhead view of a substrate including multiple layers and multiple processed regions;

FIG. 9 illustrates a cross-sectional view of the substrate showing various regions and layers of the substrate of FIG. 8.

DETAILED DESCRIPTION

Figure 2:
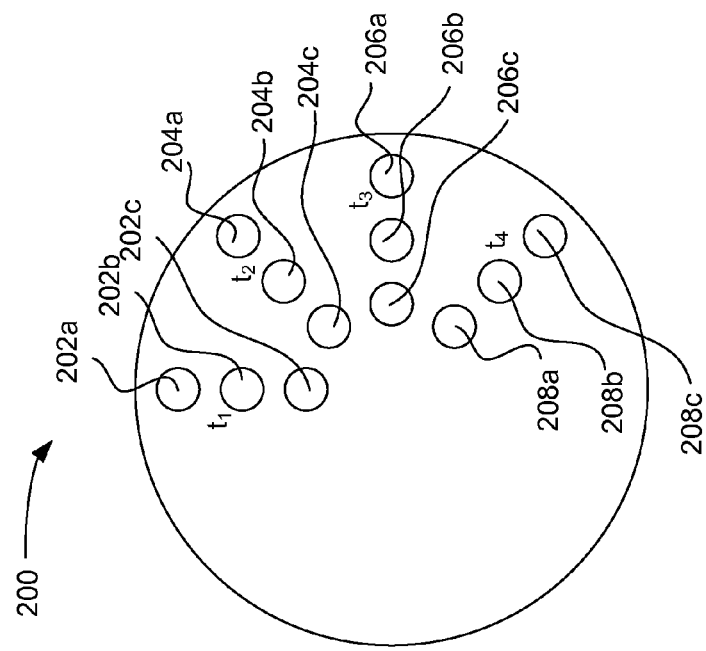
FIG. 2 illustrates a substrate including multiple regions formed thereon using the mask of FIG. 1.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, techniques for combinatorially evaluating dry semiconductor processing techniques are disclosed. Some embodiments can be used to determine optimum processing parameters for dry semiconductor processes for both time (e.g., time history of plasma source and/or chemistry conditions incrementally varied within a given overall process recipe) of the dry processing source and geometry of the substrate relative to the source. According to these and other embodiments, a combinatorial processing tool can include provisions for using a mask including a plurality of apertures. In some embodiments, the apertures are arranged along a radius or arc beginning from the center of the mask. The mask is positioned between a semiconductor substrate and a processing source such as a plasma or ion source. The mask can then be rotated to generate a series of geometry- and time-dependent regions on the substrate. Each of the regions corresponds to a profile that can be examined to determine an optimum geometry and time (e.g. duration) for a particular dry process.

In another embodiment, a substrate having multiple layers can be used to create a "time-lapse" view of an etching process sequence. A rotatable mask including at least one aperture can be placed between an etching source and the substrate. The substrate includes multiple layers of different materials which require different etching parameters. The mask is rotated so that a first layer is etched at a first time, a first and a second layer are etched at a second time, a first, second, and third layer are etched at a third time, and so on. In this way, a "time-lapse" view of the etching process sequence and its intermediate steps can be created.

I. Combinatorial Processing

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

A. Rotatable Mask

Figure 1:
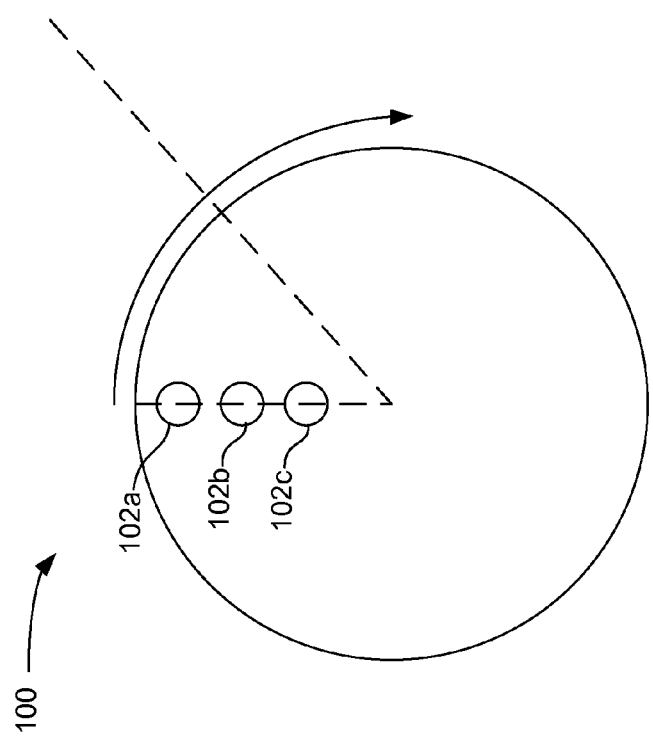
FIG. 1 illustrates a mask including a plurality of apertures.

FIG. 1 illustrates a mask 100 including a plurality of apertures 102. FIG. 2 illustrates a substrate 200 including multiple regions formed thereon using the mask 100. The mask 100 can be used with dry processes such as etching and PVD to perform those processes only on regions of the substrate 200 beneath the apertures 102 of the mask 100. For example, as is described in further detail below, the mask 100 can be placed between the substrate 200 and a source (e.g., an ion or plasma source for etching or deposition) to process regions of the substrate 200 beneath the apertures. In general, the techniques described herein can be used to evaluate and to determine an optimum time and geometry based profile for any flux-based process.

The mask 100 is rotatable 104 and the apertures 102 are aligned along a radius 106 of the mask 100. By rotating the mask 100 time-dependent and geometry-dependent sets of regions 202, 204, 206, and 208 can be formed on the substrate 200. Etching, deposition, and other dry processes can have different results depending on different input processing parameters including etch power, wafer bias power, pressure, and temperature, which can also depend as a function of time and geometry (i.e., distance from the center of the mask 100 which corresponds to a distance from the source). The rotation of the mask 100 can be used to vary the time and the geometry of the dry semiconductor process for combinatorial evaluation.

The mask can be made from any appropriate material such as steel or other metals. In some embodiments, the mask 100 can be made of a same material as the substrate 200. For example, both the mask 100 and the substrate 200 can be semiconductor wafers. If the mask 100 is a same material as the substrate 200, background effects (e.g. pattern density and loading effects for plasma etch) can be studied and/or more accurately controlled.

The regions 202-208, as shown here, can be referred to as "site isolated," because each of the regions 202-208 is formed individually and isolated from those surrounding it. Site isolated regions can each be used to evaluate the individual parameters used to create that region. However, in some examples, the regions 202-208 are not isolated, and may be adjacent to or overlap each other.

The regions include regions 202 formed at a time $t_1$, regions 204 formed at a time $t_2$, regions 206 formed at a time $t_3$ and regions 208 formed at a time $t_4$. The regions 202a, 204a, 206a, and 208a are formed closest to the center of the substrate 200, while the regions 202c, 204c, 206c, and 208c are formed further out. Therefore, using the mask 100, regions 202-208 can be formed and evaluated to determine the effect of both time and geometry on regions created using dry processes.

B. Combinatorially Processed Substrate

1. Time and Geometry-Dependent Regions

FIG. 2 illustrates a substrate having multiple regions. The substrate 200 as shown is a circular wafer that may be any size wafer, such as a 200 mm or a 300 mm wafer. However, substrates used for combinatorial processing as described herein may have any size or shape, such as rectangular coupons that are diced portions of wafers or large substrates used in flat panel or solar applications. As used herein, a substrate may be, for example, a semiconductor wafer, portion of a semiconductor wafer, other semiconductor substrate, or solar photovoltaic circuitry. The term "substrate" includes wafers, a coupon, which is a diced portion of a wafer, or any other device on which semiconductor processes are performed. The coupon or substrate may additionally contain one die, multiple dice (connected or not through the scribe), or a portion of die with useable test structures. In some embodiments, multiple coupons, or dice can be diced from a single wafer and processed combinatorially.

For example, the substrate can be a semiconductor substrate having none, one, or more layers deposited thereon. The substrate can be a "blanket" substrate that includes a uniform surface, or a "patterned" substrate that may include features such as semiconductor device structures. Combinatorial processing can be performed on these blanket or patterned substrates to determine the effectiveness of various dry processing techniques.

The substrate 200 includes multiple regions 202-208. Although the regions 202-208, as shown here, are circular, a region may be any portion of a substrate, for example an area on the substrate. In some embodiments, a region can be defined separately from other regions (i.e., the region is site isolated). In other embodiments, regions may overlap or be adjacent to neighboring regions. For example, multiple regions may be formed by performing a dry etch through multiple apertures of a mask. The substrate 200, which is positioned below the mask, includes regions 202-208 corresponding to a position of the apertures of the mask (see description below).

In some embodiments, the regions 202-208 can all be created using a source that uses a same set of operating parameters. For example, an etching source could use a constant etch power, chemistry, pressure, and temperature to generate each of the regions 202-208 so that geometry and time can be isolated as variables. After the regions 202-208 are etched or otherwise processed, the regions 202-208 can be evaluated (e.g., characterized using electrical tests or microscopy) and compared, and none, one, or more of the process variables (i.e., a specific geometry or time) can be selected for further evaluation or for integration into production sequences.

In other embodiments, the operating parameters of the dry processing source can change over time. In one example, a plasma-based dry processing source can be used. The substrate may have multiple layers of different materials that may require different plasma chemistries for etching. Additionally, different plasma chemistries may be desired to obtain different etch shapes. In some embodiments, the plasma chemistry of the source can be changed at each interval (e.g., one plasma chemistry can be used at time $t_1$, another at time $t_2$, etc.)

Plasma chemistries can depend on desired anisotropies, selectivities, etch rates, shapes, etc. For example, the radical species of the plasma, as well as other processing variables (e.g., temperature and pressure) can determine the performance and suitability of the plasma. In these embodiments, the effect of changing plasma chemistries over time can be measured over one or more materials.

2. Time-Lapsed Etching Profiles

In some examples, the time parameter can refer to etching profiles that etch multiple layers of a substrate. A substrate can include two or more layers of material, for example, a substrate used to create a dual damascene structure. At a time $t_1$, a first layer of the substrate is etched at a first region of the substrate using a first set of etching parameters used to etch the material of the first layer. At a time $t_2$, and at a second region of the substrate, a first layer is etched using the first set of etching parameters, and a second layer is etched using a second set of etching parameters. This sequence creates a single substrate that includes a time-lapse view of an etching process.

3. Other Combinatorial Variables and Combinatorial Evaluation

In other embodiments, the regions 202-208 can be formed using different processing parameters in addition to the variation of time and geometry. For example, the regions 202, 204, and 206 can be formed using different parameters (e.g., different temperatures or etch powers) for unit processes or using different processing sequences (e.g., a different order of unit processes) to evaluate parameters of dry etching techniques.

A unit process is an individual process used for semiconductor fabrication. Examples of unit processes include application of ions for an RIE process, application of plasma for a plasma etching process, PVD deposition processes, etc. A process sequence is the sequence of individual unit processes used to perform a semiconductor process (e.g., to deposit a layer or to remove a portion of a layer).

Using combinatorial processing, any of the materials, unit processes, or process sequences can be varied across regions of one or more substrates. As examples:

Different materials (or the same material having different characteristics) can be deposited on different regions of one or more substrates Different unit processes can be performed across regions, or variations of unit processes (e.g., etch the region 202a using a first power, and etch the region 204a using a second power, or using different plasma chemistries across regions) can be performed The order of unit processes, e.g., the sequence of individual unit processes used to deposit a layer can be changed. Additionally, unit processes can be added to or omitted from process sequences.

As discussed above, the unit processes or process sequences of a dry processing source can be varied over time. For example, a dry processing source can be a plasma source used to etch one or more materials on a substrate. The plasma chemistries can be varied, and the sequence of the etching steps can be varied.

C. Combinatorial Workflow

Figure 3:
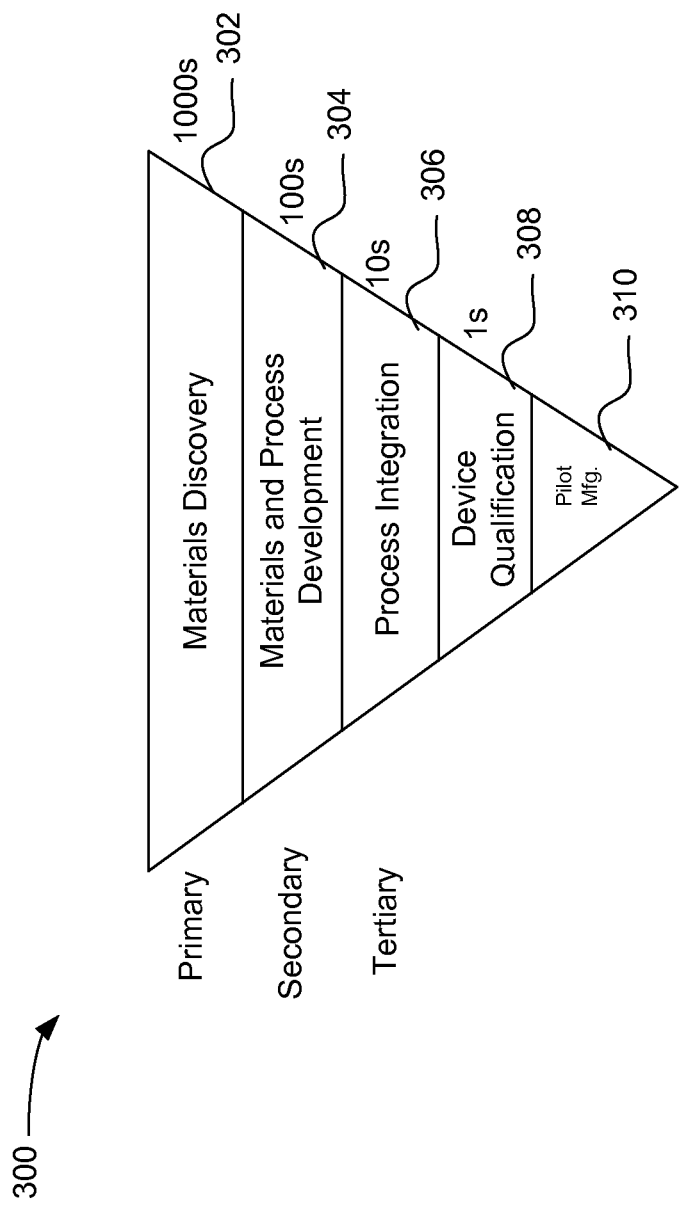
FIG. 3 illustrates a schematic diagram for implementing combinatorial processing and evaluation.

FIG. 3 illustrates a schematic diagram 300 for implementing combinatorial processing and evaluation. The schematic diagram 300 illustrates that the relative number of combinatorial processes run with a group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 302. Materials discovery stage 302 is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage 304. Evaluation of the materials is performed using metrology tools such as electronic testers and imaging tools (e.g., microscopes).

The materials and process development stage 304 may evaluate hundreds of materials (e.g., a magnitude smaller than the primary stage) and may focus on the processes used to deposit or develop those materials. Promising materials and processes are again selected, and advanced to the tertiary screen or process integration stage 306, where, for example, tens of materials and/or processes and combinations are evaluated. The tertiary screen or process integration stage 306 may focus on integrating the selected processes and materials with other processes and materials.

The most promising materials and processes from the tertiary screen are advanced to device qualification 308. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to manufacturing 310.

The schematic diagram 300 is an example of various techniques that may be used to evaluate and select materials and processes for the development of semiconductor devices. The descriptions of primary, secondary, etc. screening and the various stages 302-310 are arbitrary and the stages may overlap, occur out of sequence, be described and be performed in many other ways. Techniques for selecting a geometry and time using combinatorial processing can be included in any of the stages described above. For example, after materials have been selected in stage 302, an etch process can be performed in stage 304 to determine an optimum etch profile for the material.

II. Combinatorial Processing Tool

Figure 4:
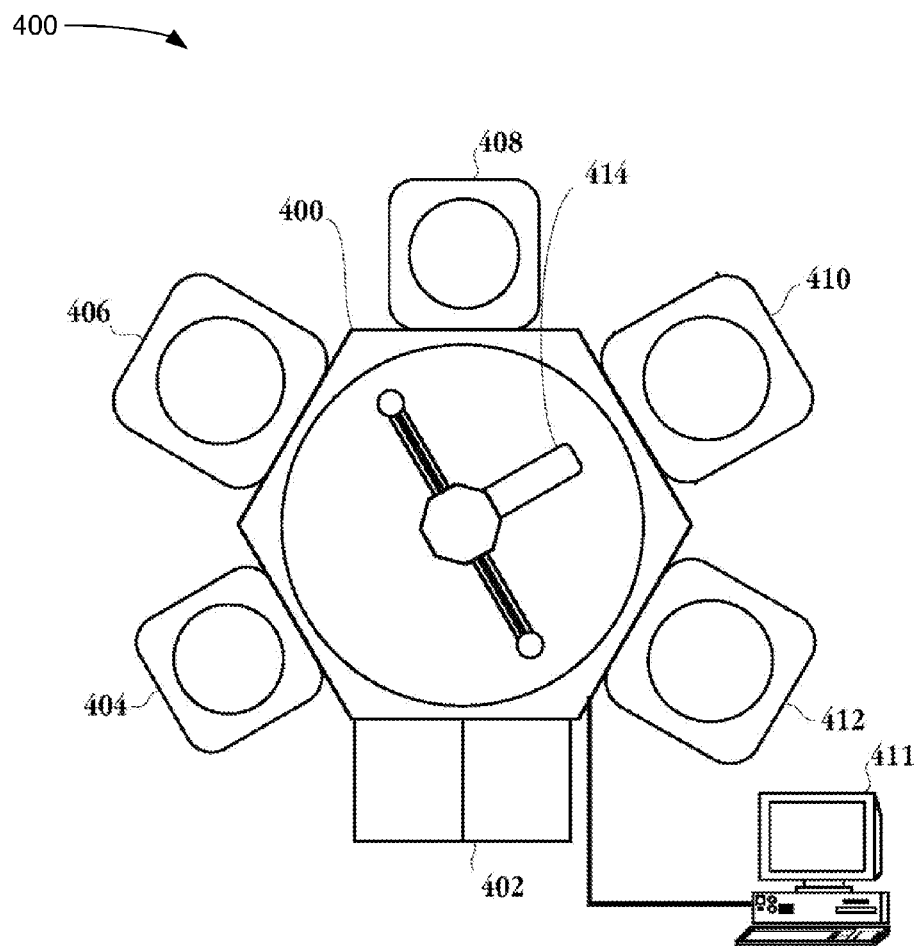
FIG. 4 is a simplified schematic diagram illustrating an integrated high productivity combinatorial (HPC) deposition system in accordance with one embodiment of the invention.

FIG. 4 is a simplified schematic diagram illustrating an integrated high productivity combinatorial (HPC) deposition system in accordance with one embodiment of the invention. For example, this system can be used to form time- and geometry-dependent profiles on a substrate similar to those shown above in FIG. 2. The system is capable of performing both combinatorial and full-substrate processing on a single substrate. For example, the system can combinatorially process several regions of a substrate, and then perform a blanket process (e.g., depositing a layer or etching an existing layer) over the entire substrate.

The HPC deposition system includes a frame 400 supporting a plurality of processing modules. It should be appreciated that frame 400 may be a unitary frame in accordance with one embodiment. However, any suitable structure configured to support the modules described herein and allow for the transportation of substrates between the plurality of modules may be utilized with the embodiments described herein. For example, frame 400 may be a plurality of separate pieces integrated together.

Load lock/factory interface 402 provides access into the plurality of modules of the HPC deposition system. In accordance with one embodiment, load lock/factory interface 402 may include a front opening unified pod (FOUP). Robot 414 provides for the movement of substrates (and masks) between the modules and for the movement into and out of the load lock 402. Module 404 may be an orientation/degassing module in accordance with one embodiment. That is, module 404 may align a substrate in one embodiment. It should be appreciated that through notches or other markings on the substrate, module 404 may perform this alignment function in order to consistently place a substrate in the plurality of modules. In addition, module 404 may serve as a degas module where before (or after) any processing, such as the deposition processes described herein, the substrate may degas in module 404. Module 406 may be a clean module in accordance with one embodiment of the invention. The cleaning performed by module 406 may be a plasma based or a non-plasma based process. In one embodiment the cleaning can be a vapor based process. The cleaning may be a dry process, but is not limited to dry cleaning processes, as wet cleaning processes used in semiconductor processing may also be incorporated. Any of the known cleaning processes commonly used in semiconductor manufacturing operations may be performed in module 406. For example, an argon containing sputter clean or a hydrogen containing reactive clean can take place through module 406.

Module 408 is referred to as a library module in accordance with one embodiment of the invention. In module 408, a plurality of masks, also referred to as processing masks, are stored. For example, the mask 100 shown in FIG. 1, other similar masks, or different types of masks, can be used with the system. The masks may be used in the combinatorial processing modules in order to apply a certain pattern to a substrate being processed in those modules. It should be appreciated that library module 408 and the masks contained therein enable spatial variation (i.e., varied regions) across substrates being processed. Furthermore, the site isolation processing is capable of being performed with spatial definition across multiple layers without incurring a vacuum break during the processing in the high productivity combinatorial (HPC) deposition system described herein. The capability of spatially varying the feature sets through the different masks, in conjunction with the controlled environment processing of the HPC deposition module, offers a powerful tool for evaluating various material components independently or contemporaneously with various process sequences. In other words, module 408, in combination with a HPC module enables the evaluation and coupling of process sequences along with the materials and process libraries.

Module 410 includes a combinatorial processing module in accordance with one embodiment of the invention. Module 410 is capable of combinatorially processing a substrate such as the substrate 200. In one embodiment, the module 410 can be used to perform combinatorial etching, while in another embodiment the module 410 can be used to perform combinatorial deposition. Module 410 is described in more detail regarding FIGS. 5 and 6. A mask (e.g., the mask 100) from library module 408 can be supplied to module 410 by robot 414.

Module 412 is a conventional deposition module in accordance with one embodiment of the invention. Module 412 may include a module configured to perform conventional physical vapor deposition (PVD), chemical vapor deposition (CVD), atomic layer deposition (ALD), plasma enhanced atomic layer deposition (PEALD), rapid thermal processing (RTP), plasma etching, etc., processes in accordance with one embodiment of the invention. Thus, while HPC module 410 may perform combinatorial processing, module 412 will perform parallel processing across an entire substrate (e.g., wafer) under conventional techniques. In other words, combinatorial processing techniques can be combined with full-substrate processing techniques. It should be appreciated that while FIG. 4 illustrates a specific configuration of the modules, this configuration is not meant to be limiting. That is, any combination of modules may be incorporated in the HPC system as long as a combinatorial module, such as module 410 is included. Thus, numerous configurations of the processing system of FIG. 4 are possible. It should be noted that the functionality provided by the library module 408 may be provided through a load lock module dedicated to the storage of the process masks in one embodiment.

One skilled in the art will appreciate that a controller may control the operations and the processes referred to herein. That is, a recipe for a certain process is programmed into the memory of a controller and the controller executes the recipe by manipulating valves, power supplies, robots, and other physical devices of the modules of the cluster tool to achieve the desired functionality. The controller may be part of a computing system having a graphical user interface for viewing the process, process results of an in-situ testing, as well as modifying the recipe. The computing device will include a central processing unit (CPU), a memory, a bus for communication between the memory and the CPU, as well as input/output capability and a display. In one embodiment, a centralized controller, i.e., computing device 411, may control the processes of the HPC system. Alternatively, each module may have a controller in communication with centralized computing device 411. Of course, controllers may be local to some modules while other modules may be controlled through centralized computing device 411.

The environment within frame 400 is controlled to provide an environment that is not deleterious to the processing operation being performed. In one embodiment, the environment may operate in a controlled inert environment. For example oxygen may be pumped out of the environment and replaced with an inert gas. Examples of gases that can be pumped in to replace oxygen may be, for example, argon, nitrogen, and other inert gasses that will not negatively react with the substrate processing operations. In this embodiment the oxygen is removed to a level sufficient to avoid any oxidation of processed substrates prior and/or between subsequent processing. In another embodiment, the environment within frame 400 is maintained at a vacuum. In this embodiment, the pressure within the module may be maintained between about 10 Torr and about $10^{-10}$ Torr. It should be appreciated that the environment may be initially pumped down to a certain vacuum level and then as process gases are injected into the respective chambers a vacuum state is maintained. Furthermore, by pumping down initially to a low pressure, such as about $10^{-6}$ to $10^{-10}$ Torr, any contaminants present are essentially removed. As the unitary mainframe is airtight in one embodiment, the environment is controlled and protected from any contaminants breaching the frame environment.

In another embodiment, the environment may be maintained at a positive pressure, and it should be appreciated that the actual ranges provided are exemplary and not meant to be limiting as control of the environment is maintained according to the processing operations being performed. One skilled in the art will appreciate that numerous techniques may be utilized to control the moisture, humidity, particulate matter, temperature, pressure, and any other property of the environment so as to enable the movement of substrates and masks between modules and through the frame environment without having any deleterious effects being introduced to the substrates, masks, processes being performed on the substrates, and/or structures defined by these processes.

III. Time- and Geometry-Dependent Dry Combinatorial Processing Module

A. System for Time- and Geometry-Dependent Dry Combinatorial Processing

Figure 6:
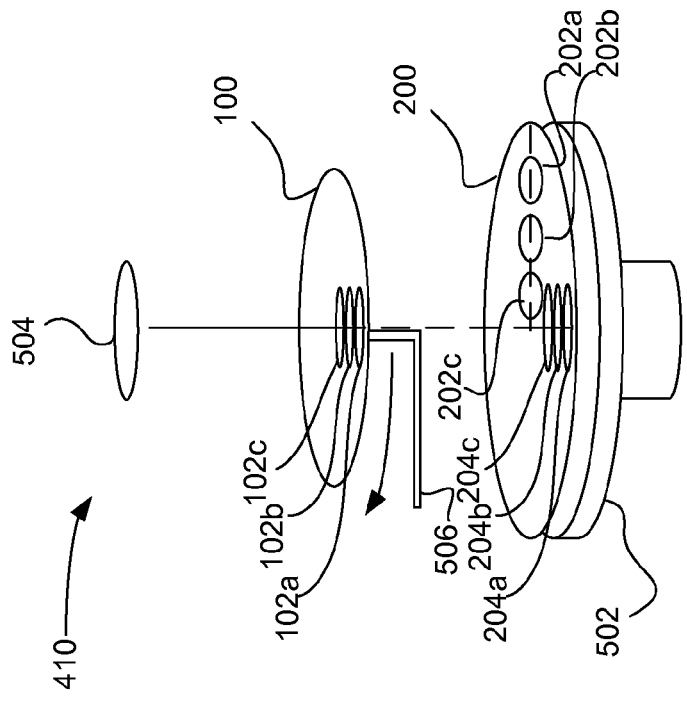
FIGS. 5 and 6 illustrate variation of time and geometry when using dry processing according to various embodiments.
Figure 5:
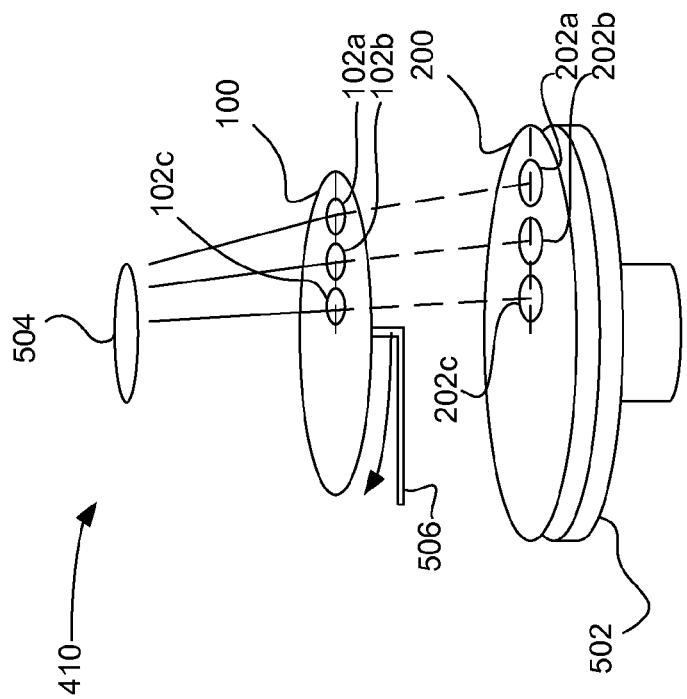

FIGS. 5 and 6 illustrate variation of time and geometry when using dry processing according to various embodiments. The module 410 is the combinatorial module described above. The module includes a substrate holder 502 that may be a chuck, for example an electrostatic chuck (ESC). The substrate holder 502 may include heating elements or other features. A source 504 can be used for processing the substrate 200. For example, the source 504 may be a plasma or ion source for etching, or may be a target for PVD processes, or more generally flux-based processes.

The source 504 emits flux(es) of material(s) to process the substrate 200. The mask 100 physically prevents the material flux from reaching portions of the substrate 200 so that only the regions 202 having a line of sight with the source 504 through the apertures 502 are processed. The mask 100 is held in position and can be rotated by mask holder 506. The mask holder 506 can be any device having any configuration appropriate for supporting, positioning and rotating the mask 100. For example, the mask holder 506 can be an arm that contacts the center, periphery, or any other part of the mask 100.

Two parameters that can affect the outcome of dry processing include geometry and time. Variations in geometry can describe center-to-edge variation (i.e. the center of the substrate 200 is processed differently than the edge) and differences in processing different layers in the substrate. FIGS. 8 and 9 describe the combinatorial processing of a substrate including different layers. The apertures 102 are arranged so that multiple (here, three) regions 202 are created on the substrate 200 having different geometries relative to the source 504.

In one embodiment, the source is continuously active while processing the substrate and rotating the mask. Because many flux-based processes (e.g., plasma- or ion-based processes) have sources that evolve over time or plasma chemistries that change as a function of time, the time history of the source operating parameters (e.g. RF or microwave power) and/or the plasma chemistry of a source can be a combinatorial variable to be studied. Additionally, because the distance from and angle of incidence of the source (i.e., the geometry) may affect the processed region, the rotating mask techniques described herein can be used to evaluate the effects of geometry on dry processing.

The regions 202 are created at a time $t_1$. In order to study the effects of time on the processing of the substrate 200, the mask 100 is rotated as shown in FIG. 6. Alternatively, the substrate 200 may be rotated or both the substrate 200 and the mask 100 can be rotated. The regions 204 are subsequently created at a time $t_2$. A profile for dry processing at different geometries and times has therefore been created on the substrate 200. As shown in FIG. 6, the substrate 200 includes six regions corresponding to three distances from the center of the substrate 200 and two different times. A profile can be formed at any interval. For example, the time $t_2$ may be thirty seconds later than the time $t_1$. The intervals chosen for combinatorial processing can be regular or irregular; for example, the time $t_2$ may be thirty seconds later than the time while the time $t_3$ is sixty seconds later than the time $t_2$. Additionally, the apertures 102 may have any arrangement to create any desired profile. For example, the apertures 102 can be arranged along a radius of the mask 100, along an arc of the mask 100, etc., and can have any size or shape.

In some embodiments, the processing source can include a plasma source (e.g., for dry etching), and the plasma chemistry can change over time. For example, a substrate may include multiple layers of different materials, each material needing a different plasma chemistry to complete an etch. The plasma chemistry can be changed over time (e.g., at the intervals) and the etch profile is created so that the changes in the plasma chemistry over time can be evaluated. Additionally, the plasma chemistry can affect the shape of the etch, which can also be evaluated.

In addition to geometry and time, combinatorial processing can also be used to determine optimal temperatures, powers, pressures, etc. The substrate 200 can also be processed in other modules, for example combining the combinatorial processing with full wafer processing or other combinatorial processing.

B. Process for Time- and Geometry-Dependent Dry Combinatorial Processing

Figure 7:
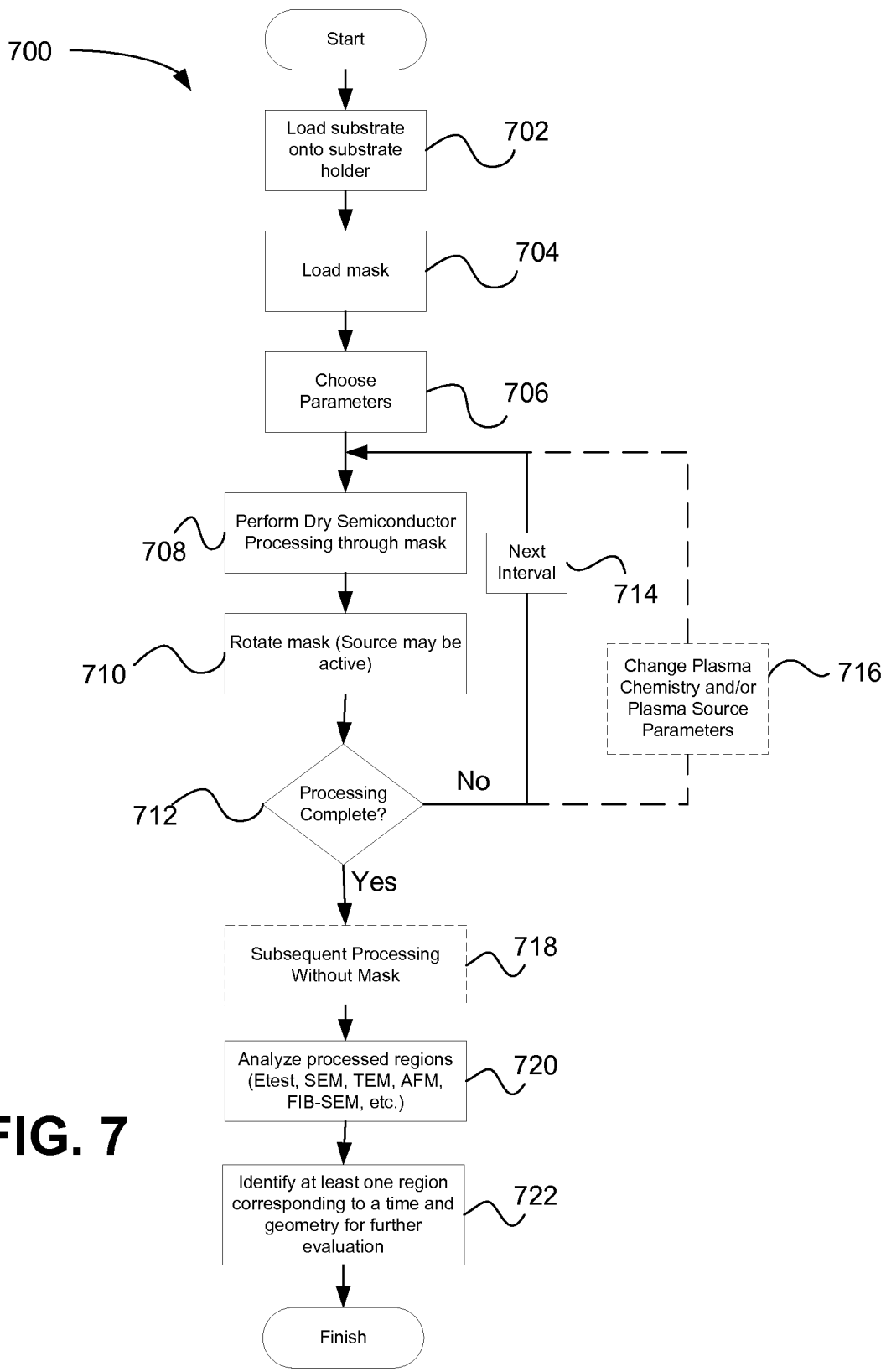
FIG. 7 is a flowchart describing a process for performing time and geometry-dependent combinatorial processing.

FIG. 7 is a flowchart describing a process 700 for performing time and geometry-dependent combinatorial processing. Generally, the process 700 readies a substrate for processing, and uses a rotating mask to create different time- and geometry-dependent profiles on the substrate.

In operation 702, the substrate is loaded onto the substrate holder. The substrate, as described above, can be any substrate or portion of a substrate (e.g., coupon) used for semiconductor processing. The substrate holder can be an ESC or other type of chuck. In operation 704, a mask is loaded into the processing chamber in between the processing source and the substrate. The mask can be loaded from the module 408, for example.

In operation 706, the parameters of the processing are selected. For example, in a plasma based process, a specific plasma can be used (e.g., using certain radicals), an etch power can be chosen, etc. The selection of process parameters can be used to enable combinatorial processing. In some embodiments, the processing parameters can be varied for different times (e.g., the etch power is increased between time $t_1$ and time $t_2$). Alternatively or additionally, different substrates can be processed using different parameters. For example a first substrate can be processed as described regarding FIGS. 5 and 6 using a first etch power, and a second substrate can be processed using a second etch power. The multiple regions on the two substrates can be compared to determine an optimum combination of time, geometry, and etch power. Generally, varying parameters allows multiple experiments to be performed on a single or multiple substrates.

In operation 708, dry semiconductor processing is performed through the mask. The processing can be any semiconductor processing that is adaptable to masking, including etching, plasma processes, and other flux-based processes. For example, if the mask includes a plurality of apertures along a radius of the mask, the processing can create a plurality of etched regions corresponding to the masks. The plurality of apertures are each a distance from the center of the substrate, which allows for experimentation regarding the geometry of the semiconductor processes.

In some embodiments, the substrate is processed continually while the mask is rotated (i.e., operation 708 occurs simultaneously with and continuously through the cycle of operations 710 and 716). By operating continuously, the effect of time on the processing source (e.g., the aging of plasma) can be studied using combinatorial processing. For flux-based and other dry processes, the age of the source can also be a combinatorial variable. Additionally or alternatively, the plasma chemistry of plasma-based sources can be changed at intervals corresponding to the rotation of the mask or at any other interval. In other embodiments, processing may not be continual.

In operation 710, the mask is rotated to process new regions on the substrate. The rotation of the mask can occur after a predetermined amount of time. For example, the substrate can be processed through the mask for thirty seconds, and then rotated to process a new region. As described above, the mask can be rotated through a predetermined angle. The angle can be sufficient so that the resulting processed regions do not overlap in some embodiments. Alternatively, the processed regions may overlap to provide additional regions (i.e., those processed for longer periods of time) for evaluation.

In operation 712, it is determined whether the processing is complete (i.e., all desired regions have been processed). If the processing is complete, the process 700 finishes. If the processing is not complete, the process 700 advances to the next interval 714. The next interval 714, for example, can be the time $t_2$. The plasma chemistry and/or plasma source parameters (e.g. power, pressure, etc.) can be changed in operation 716 before, after, or during the rotation of the mask in operation 710.

In some embodiments, after the operation 712, the substrate 200 can be transferred to another module of the tool 400 for further combinatorial or full-wafer processing, for example to do optional subsequent processing without the mask in operation 718.

The substrate 200 can also be characterized, for example using electrical testing or microscopy. For example, the characterization can be a part of the evaluation of the substrate 200 and the regions 202-208 in operation 720. The regions 202-208 can be examined using one or more of several techniques, including electrical testing (e.g., measuring resistance, capacitance, leakage, etc.) and microscopy. Microscopy includes various imaging techniques such as scanning electron microscopy (SEM), tunneling electron microscopy (TEM), atomic force microscopy (AFM), and forced ion beam SEM (FIB-SEM). FIB-SEM can be used to examine the effects of etching and other dry processes by providing a profile of the processed region, and can be an effective tool for characterization in some embodiments.

For example, when evaluating a dry etching process, the processed regions can be evaluated to determine etch rate, etch uniformity, the composition of the remaining substrate material, the effects of time (including age), the effects of geometry, etc. These results can be evaluated, and for a particular region, it can be determined whether the processing parameters used to create that region warrant further study.

In operation 722, at least one region corresponding to a time and a geometry can be identified for further evaluation. For example, the processing conditions used for the identified region can be used for further combinatorial evaluation or for high volume manufacturing.

C. "Time-Lapse" Views of Etching Process Sequence

Figure 10:
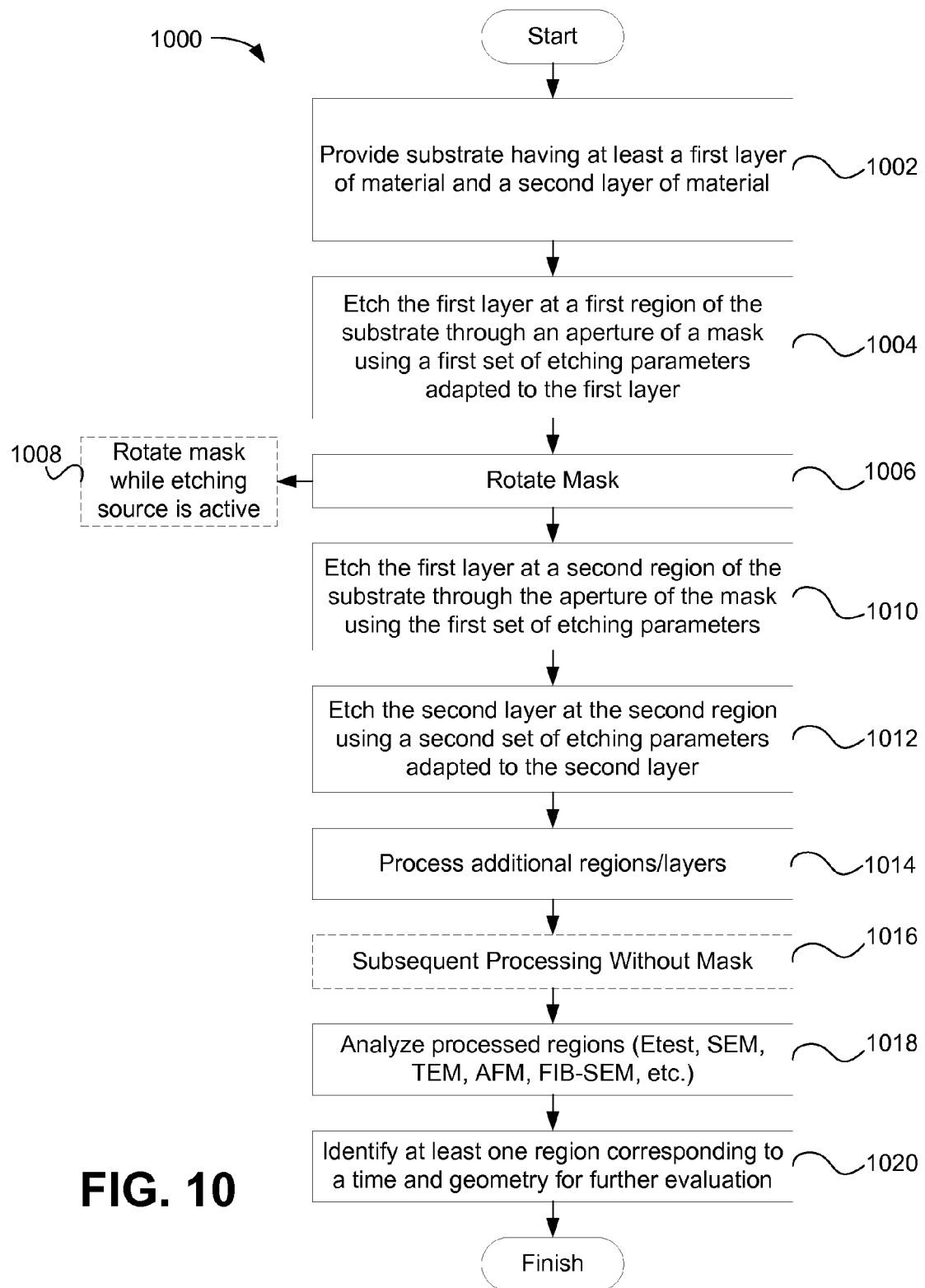
FIG. 10 is a flowchart describing a process for creating a "time-lapse" view of a multi-layer etch process sequence.

FIGS. 8 and 9 illustrate a substrate 800 including multiple layers. FIG. 8 illustrates an overhead view of the substrate 800, while FIG. 9 illustrates a cross-sectional view of the substrate showing various regions of the substrate 800 along a line 808. FIG. 10 is a flowchart describing a process 1000 for creating a "time-lapse" view of a multi-layer etching process sequence.

Multiple regions are defined on the substrate 800 by rotating the mask 100 to create regions 802a-c at time $t_1$, 804a-c at time $t_2$, and 806a-c at time $t_3$ having different geometries relative to an etching source. However, in some embodiments, the mask 100 can have any number of apertures to create any number of regions, including a single aperture to create one region per interval. In the embodiments described in FIGS. 8-10, a "time-lapse" sequence is created so that the state of a substrate during different times of an etch process sequence can be investigated. For example, at a first time $t_1$, a first layer is etched at a first region using a first set of etching parameters, and at a time $t_2$, the first layer is etched at a second region using a second set of etch parameters, and a second layer is etched at the second region using a second set of etch parameters. A "time" $t_1$ or $t_2$, for example, may refer to an interval of time rather than a point in time. This time-lapse substrate allows one to observe the state of an etch process at time $t_1$ (layer 1 etched), time $t_2$ (layers 1 and 2 etched), etc., so that the effects of a particular etch process when combined with other etch process can be analyzed.

As an example, a process sequence for creating a dual damascene structure can be analyzed using these techniques. A dual damascene structure typically requires several different etching parameters for the different materials found in the layers to be etched; using the embodiments described herein, the dual damascene process can be optimized by creating a substrate on which the state of the structure at several different time points can be observed, analyzing the regions of the substrate, and selecting etching conditions for further analysis.

The process 1000 begins with operation 1002, where a substrate having at least a first layer of material and a second layer of material is provided. The substrate can be any multi-layer substrate on which may have varying etching requirements from layer to layer. For example, the substrate can be one which includes layers in which a dual damascene structure may be created for back end of the line (BEOL) processing. The first and second layers of material can be any materials used in semiconductor processing, for example, such as conductors, dielectrics, and semiconductors.

The substrate 800, as shown in cross-section in FIG. 9 includes several layers that can be used for creating a dual damascene structure. A top or first interlayer dielectric (ILD) 902 may be a material such as silicon dioxide or a low-k dielectric. An etch stop layer 904 can be, for example, silicon nitride or other similar materials that are etch selective to the material of the first ILD 902. A second ILD 906 can, like the first ILD 902, be silicon dioxide or a low-k dielectric. In some examples, the second ILD 906 includes a different material than the first ILD 902 (for example, the second ILD 906 could be silicon dioxide, while the first ILD 902 is a low-k dielectric). Etch stop layer 908 may also be silicon nitride or another etch stop material. The layer 910 is a lower level of metallization, in which a conductor such as an interconnect 912 is formed.

FIG. 9 shows a cross section of the substrate 800 along the line 808, which shows the regions 802b, 804b, and 806b. It is understood that this cross section is shown as an example. It is further understood that the other regions (802a and 802c, 804a and 804c, and 806a and 806b) may have different properties because of their different geometries relative to the etch source.

In operation 1004, the first layer is etched at a first region through an aperture of the mask 100. The first region can be one of the regions 802, which are processed at a time $t_1$. The first layer is etched using a first set of etching parameters adapted to the first layer. In other words, the first set of etching parameters is tailored to etch the material of the first layer. For example, if the first layer is silicon oxide and the etching source is an RIE source, the source gases may contain $CHF_3$ and $CF_4$. Other parameters, such as pressures and durations, can also be specified.

As is shown in FIG. 8, multiple regions 802 (i.e. 802a-c) are etched during the time $t_1$. As is further shown in FIG. 9, the operation 1004 can open a via or trench 914 in the first ILD 902. The multiple regions 802a-c can be etched to create regions that can be used measure the effects of geometry, for example the etching of the sidewalls 916 of the trench 914 can be affected by the distance of the region 802 from the center of the substrate or the offset from the location of the etching source (see FIG. 5).

In operation 1006, the mask 100 is rotated. The mask 100 can be rotated to process or etch another area of the substrate

800. For example, the mask 100 can be rotated to process the regions 804. In some embodiments, the etching source is active during the rotation, as is shown in operation 1008.

In operation 1010, the first layer (e.g. the first ILD 902) is etched at the second region (e.g. the region 804*b*) through an aperture of the mask 100 using the first set of etching parameters. The first layer can be etched using the first set of etching parameters that were used in operation 1004 to etch the first layer at the first region. As shown in FIG. 9, the first ILD 902 is etched at the second region 804*b*.

In operation 1012, the second layer (e.g. the etch stop layer 904) is etched at the second region (e.g. the region 804*b*) using a second set of etching parameters adapted to the second layer. As shown in FIG. 9, the etch stop layer 904 is etched at the second region 804*b*. The second layer is etched using a second set of etch parameters that are tailored to etch the material of the second layer. For example, if the second layer is silicon nitride and the etch process is RIE, the second layer can be etched using an $SF_6$-containing source gas chemistry.

After operation 1012 is complete, two sets of regions (e.g. regions 802 and 804) have been processed at different intervals (e.g. at times $t_1$ and $t_2$). The processing of the first region includes etching of the first layer and the processing of the second region includes etching of the first layer and the second layer. In this way a "time-lapse" view of a multi-step etching process sequence can be created so that the results of the multi-step etching process sequence can be reviewed and analyzed at various points throughout the etching sequence while only processing a single substrate.

In operation 1014, other layers of the substrate 800 can be etched in other regions. For example, a third layer (e.g. the second ILD 906) can be etched in a third region (e.g. the region 806*b*) using a third set of etching parameters. As shown in FIG. 9, the first ILD 902, the etch stop layer 904, and the second ILD 906 have been etched using the appropriate etch parameters. Various additional layers can also be etched using these techniques.

In some embodiments, after the operation 1014, the substrate 800 can be transferred to another module of the tool 400 for further combinatorial or full-wafer processing, for example to do optional subsequent processing without the mask in operation 1016.

The substrate 800 can also be characterized, for example using electrical testing or microscopy. For example, the characterization can be a part of the evaluation of the substrate 800 and the regions 802-806 in operation 1018. The regions 802-806 can be examined using one or more of several techniques, including electrical testing (e.g., measuring resistance, capacitance, leakage, etc.) and microscopy, as described above regarding operation 720.

In operation 1020, at least one region corresponding to a time and a geometry can be identified for further evaluation. For example, the processing conditions used for the identified region can be used for further combinatorial evaluation or for high volume manufacturing.

Although an etching process sequence is described, it is understood that other processing techniques can also be used with the embodiments described in FIGS. 8-10. For example, a time-lapse sequence of an additive process (such as PVD) can be created using a process similar to the process 1000 of FIG. 10.

In this example, a substrate is provided in operation 1002. A layer is created in a first region of the substrate by performing a PVD process through an aperture of the mask using a first set of deposition parameters in operation 1004. In operation 1006, the mask is rotated to position the mask so that material can be deposited in a second region on the substrate. In operation 1010, a first layer is created in the second region using the first set of deposition parameters (e.g. the first layer in the second region is the same material as the layer in the first region). In operation 1012, a second layer is created over the first layer in the second region. And so on. Once the time-lapse layers have been created, in operations 1018 and 1020 the regions can be analyzed and certain materials can be selected for further analysis.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A combinatorial semiconductor processing tool, comprising:
   a substrate holder;
   a dry semiconductor processing source to process a substrate held by the substrate holder; and
   a mask holder to hold a mask between the substrate holder and the dry semiconductor processing source;
   wherein the mask and the substrate comprise a same material;
   wherein the mask comprises a plurality of apertures; and
   wherein the mask holder is configured to rotate the mask when the dry semiconductor processing source is operating to process multiple regions of the substrate at intervals and process the substrate combinatorially.

2. The processing tool of claim 1, wherein the apertures are arranged to study geometry effects of the processing.

3. The processing tool of claim 1, wherein the plurality of apertures are arranged along a radius of the mask.

4. The processing tool of claim 1, wherein the substrate holder, mask holder, and dry semiconductor processing source are housed in a first module, and further comprising:
   a frame connected to the first module;
   a second module connected to the frame to perform full-substrate processing on the substrate; and
   a robot connected to the frame to move the substrate between the first module and the second module.

* * * * *